(12) United States Patent
Toriyama (10) Patent No.: US 7,019,393 B2
(45) Date of Patent: Mar. 28, 2006

(54) ELECTRIC CIRCUIT SUBSTRATE

(75) Inventor: Shigetaka Toriyama, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/920,659

(22) Filed: Aug. 18, 2004

(65) Prior Publication Data

US 2005/0040544 A1    Feb. 24, 2005

(30) Foreign Application Priority Data

Aug. 22, 2003  (JP) .......................... P2003-299266

(51) Int. Cl.
*H01L 23/48*    (2006.01)
*G02F 1/1345*   (2006.01)

(52) U.S. Cl. ...................... 257/692; 257/737; 257/719; 349/149; 349/150

(58) Field of Classification Search .................... None
See application file for complete search history.

(56) References Cited

U.S. PATENT DOCUMENTS

| | | | | |
|---|---|---|---|---|
| 4,818,728 A | * | 4/1989 | Rai et al. | 438/108 |
| 5,371,037 A | * | 12/1994 | Yonehara | 438/459 |
| 6,245,594 B1 | * | 6/2001 | Wu et al. | 438/108 |
| 2003/0168734 A1 | * | 9/2003 | Fang | 257/734 |
| 2004/0032024 A1 | * | 2/2004 | Lee et al. | 257/734 |
| 2004/0099949 A1 | * | 5/2004 | Cho | 257/734 |
| 2005/0218476 A1 | * | 10/2005 | Lee et al. | 257/529 |

* cited by examiner

*Primary Examiner*—Dung Le
*Assistant Examiner*—Long Tran
(74) *Attorney, Agent, or Firm*—Robert J. Depke; Trexler, Bushnell, Giangiorgi, Blackstone & Marr, Ltd.

(57) ABSTRACT

On a glass substrate of a liquid crystal display device, electrode parts to which metallic electrodes (bumps) of an IC circuit are connected from an upper part are formed. The electrode parts are formed by opening an interlayer dielectric film at parts corresponding to metal wiring and forming land shaped electrode pads in the opening parts. In this invention, the planar forms of the electrode pads are smaller than the opening parts of the interlayer dielectric film. Thus, the planarization of the peripheral surfaces around the electrode parts is improved. Accordingly, integrated circuit devices (IC) or semiconductor chips can be connected with high reliability.

2 Claims, 12 Drawing Sheets

ELECTRIC CIRCUIT SUBSTRATE

BACKGROUND OF THE INVENTION

1. Field of the Invention

The present invention relates to an electric circuit substrate having an electrode part to which integrated circuit devices (IC) or semiconductor bare chips are connected.

This application claims priority of Japanese Patent Application No. 2003-299266, filed on Aug. 22, 2003, the entirety of which is incorporated by reference herein.

2. Description of the Related Art

In recent years, in order to achieve the miniaturization of a liquid crystal display device, integrated circuit devices (IC) or semiconductor bare chips serving as a driving circuit, a peripheral circuit or the like are directly attached to a peripheral edge part of a glass substrate on which a liquid crystal display part is formed.

Figure 1A:
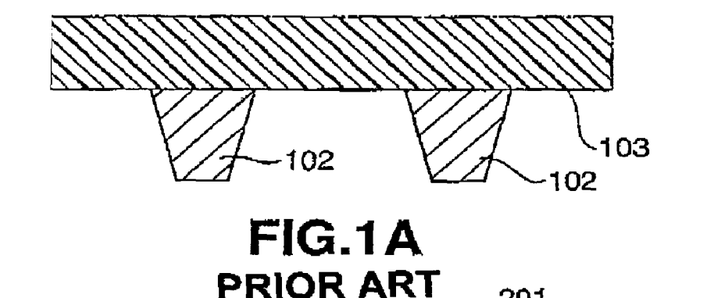
FIGS. 1A–1C are a view for explaining a conventional method for attaching under pressure the bumps of an IC to an electrode part.
Figure 1B:
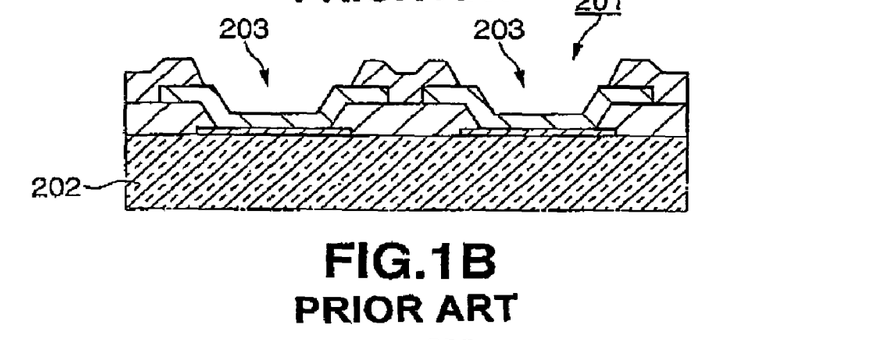
Figure 1C:
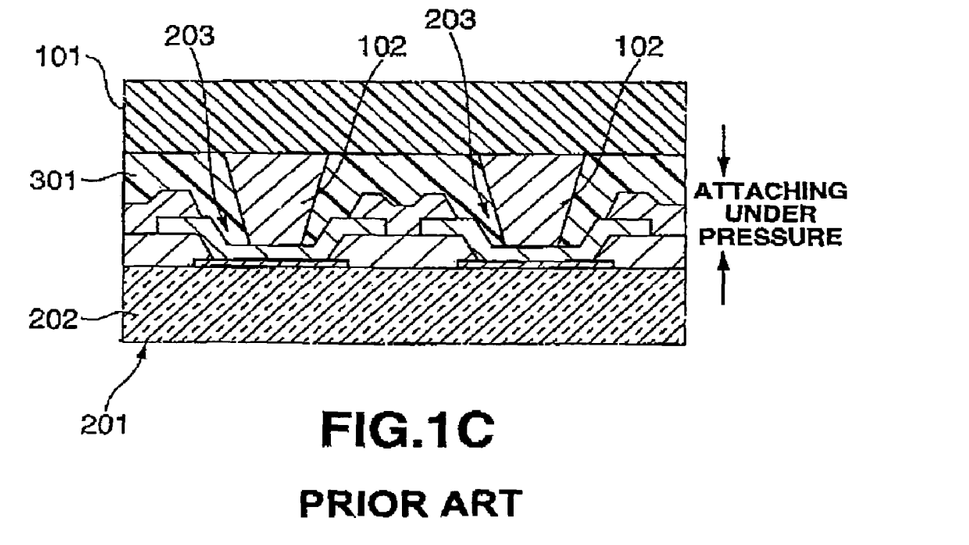

For instance, when an IC 101 is directly attached to a peripheral edge part of a glass substrate 202 around a liquid crystal display part 201, as shown in FIG. 1A, protrusion shaped bumps 102 serving as connecting terminals are provided on a bottom surface part 103 of the IC 101. Further, as shown in FIG. 1B, on the peripheral edge part of the glass substrate 202 around the liquid crystal display part 201, electrode parts 203 exposed upward are formed. Further, as shown in FIG. 1C, while the bumps 102 are arranged at positions corresponding to the electrode parts 203, the IC 101 is attached under pressure to the liquid crystal display part 201 through an anisotropic conductive film 301 from an upper part toward a lower part. Thus, the IC 101 is fixed to the peripheral edge part around the liquid crystal display part 201 and the inner wirings of the IC 101 is connected to the inner wiring of the liquid crystal display part 201.

Now, a process for forming the electrode parts 203 formed on the peripheral edge part around the liquid crystal display part will be described in more detail.

Figure 2A:
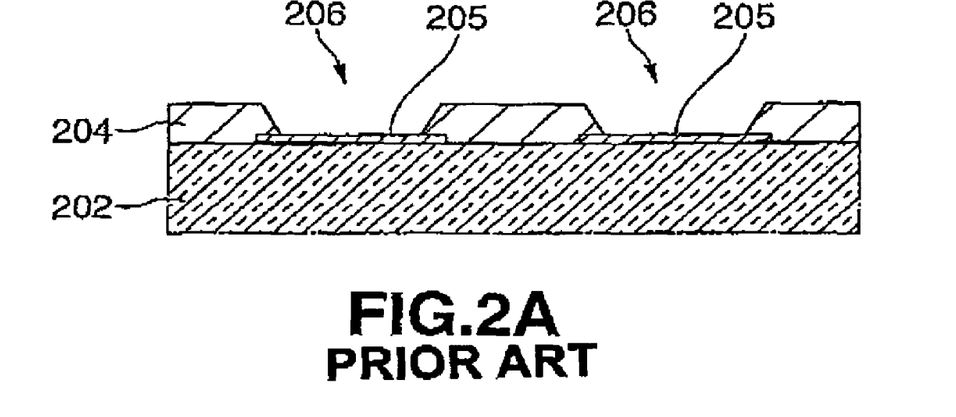
FIGS. 2A–2C are a view for explaining a conventional method for forming an electrode part.
Figure 2B:
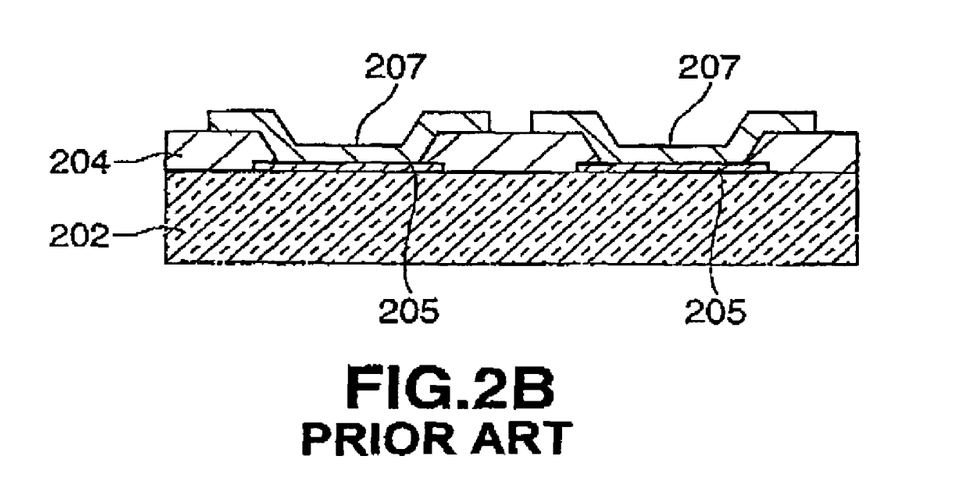

As shown in FIG. 2A, on the glass substrate 202 on which the liquid crystal display part is formed, interlayer dielectric films 204 are formed. Further, between the glass substrate 202 and the interlayer dielectric films 204, metal wiring 205 is formed. When the electrode parts 203 are formed, the interlayer dielectric films 204 are firstly partly opened to form opening parts 206 and the metal wiring 205 is exposed upward from the opening parts 206. Then, as shown in FIG. 2B, on the opening parts 206, electrode pads 207 made of a metallic material are formed. At this time, the electrode pads 207 are formed in areas larger than the opening parts 206 so as to assuredly come into contact with the metal wiring 205. That is, the electrode pads 207 are formed at positions including the interlayer dielectric films 204 around the peripheral edge parts of the opening parts 206.

Figure 2C:
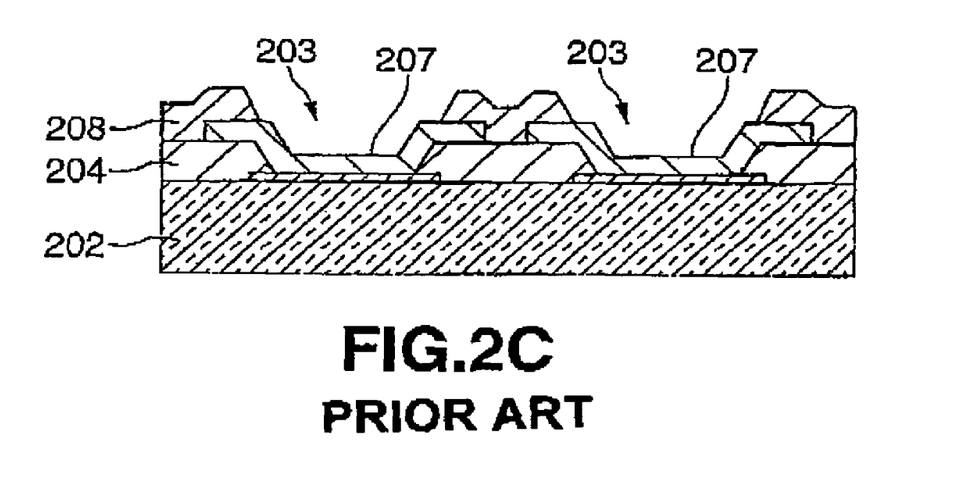

Subsequently, as shown in FIG. 2C, planarizing films 208 having an insulating property are formed, and then, parts on which the electrode pads 207 are formed are opened to complete the electrode parts 203.

Figure 3:
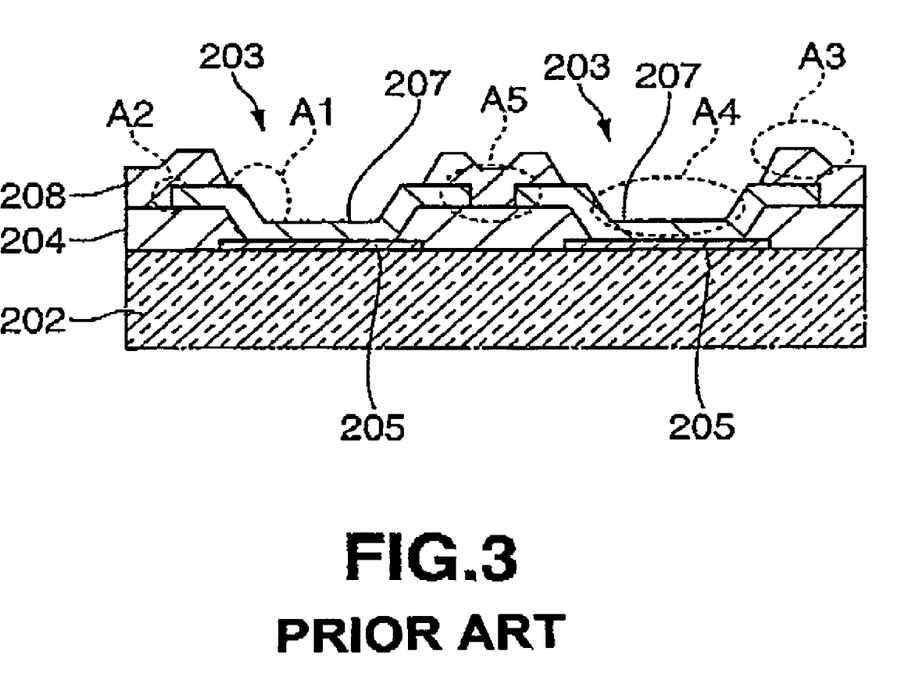
FIG. 3 is a view for explaining problems of a conventional electrode part.

In the usual electrode parts 203 as described above, between the peripheral edge part of the electrode pad 207 and the central part of the electrode pad 207, a step (difference in position in the direction of the thickness of the film, for instance, a part A1 in FIG. 3) is generated. On the interlayer dielectric film 204, a step corresponding to the thickness of the electrode pad 207 (for instance, a part A2 in FIG. 3) is generated. Ordinarily, for the purpose of eliminating the steps, the planarizing films 208 having the insulating property are used for coating. However, a complete planarization is difficult (for instance, a part A3 in FIG. 3). While the planarization process is not completely performed, when the bumps 102 of the IC 101 are attached under pressure and connected to the electrode pads 207, a displacement is generated in the direction of thickness of the film in the connecting parts of the electrodes pads 207 and the bumps 102 (for instance, a part A4 in FIG. 3) to cause a defective electric connection.

In the usual electrode parts 203, the electrode pads 207 are formed to protrude onto the interlayer dielectric films 204. Thus, the electrode pads 207 of the adjacent electrode parts 203 may come into contact with each other (for instance, a part A5 in FIG. 3). Further, such a failure as to break the interlayer dielectric films 204 or the electrode pads 207 may be generated due to a slight displacement in a planar direction, which constitutes a factor of causing the yield or reliability of a product to be lowered. Further, the electrode pads 207 are formed to protrude onto the interlayer dielectric films 204, so that pitches between the adjacent electrode parts 203 are restricted and the pitch are hardly narrowed.

Further, in recent years, to reduce wiring resistance, the thickness of a wiring pattern and the thickness of the electrode pads are increased. Accordingly, on the interlayer dielectric film 204, the step corresponding to the thickness of the electrode pad 207 is formed. This step is undesirably more increased. As a result, a step in an irregular part on the planarizing film 208 is increased (for instance, a part A3 in FIG. 3). Accordingly, a deficiency that the pattern of the planarizing films 208 is stripped is undesirably generated (see Japanese Patent Application Laid-Open No. hei 10-161140).

SUMMARY OF THE INVENTION

It is an object of the present invention to provide an electric circuit substrate having electrodes to which integrated circuit devices (IC) or semiconductor bare chips can be connected with high reliability.

An electric circuit substrate according to the present invention comprises: a substrate having an insulating property; an insulating film formed on the substrate; wiring formed in the substrate; and electrode pads made of an electrically conductive material which are connected to the wiring and to which a connecting terminal of an external device is connected from an upper part. The insulating film has openings formed so as to expose the electrode pads upward and the electrode pads are smaller than the openings formed at corresponding positions.

Further, an electric circuit substrate according to the present invention further comprises a protective film formed on the insulating film. The protective film has openings formed so as to expose the electrode pads upward and the openings of the protective film are smaller than the electrode pads.

In the electric circuit substrate according to the present invention as described above, the size of the electrode pads in the planar direction is smaller than the openings formed on the insulating film.

Accordingly, in the electric circuit substrate according to the present invention, the planarization of the insulating film can be improved. As a result, for instance, when an IC is electrically connected to an electric circuit by attaching integrated circuit devices or semiconductor bare chips from an upper part, an insufficient attachment can be decreased and an attaching operation can be performed with high reliability.

DETAILED DESCRIPTION OF THE PREFERRED EMBODIMENT

Now, as the best mode for carrying out the present invention, a system display to which the present invention is applied will be described.

Figure 4:
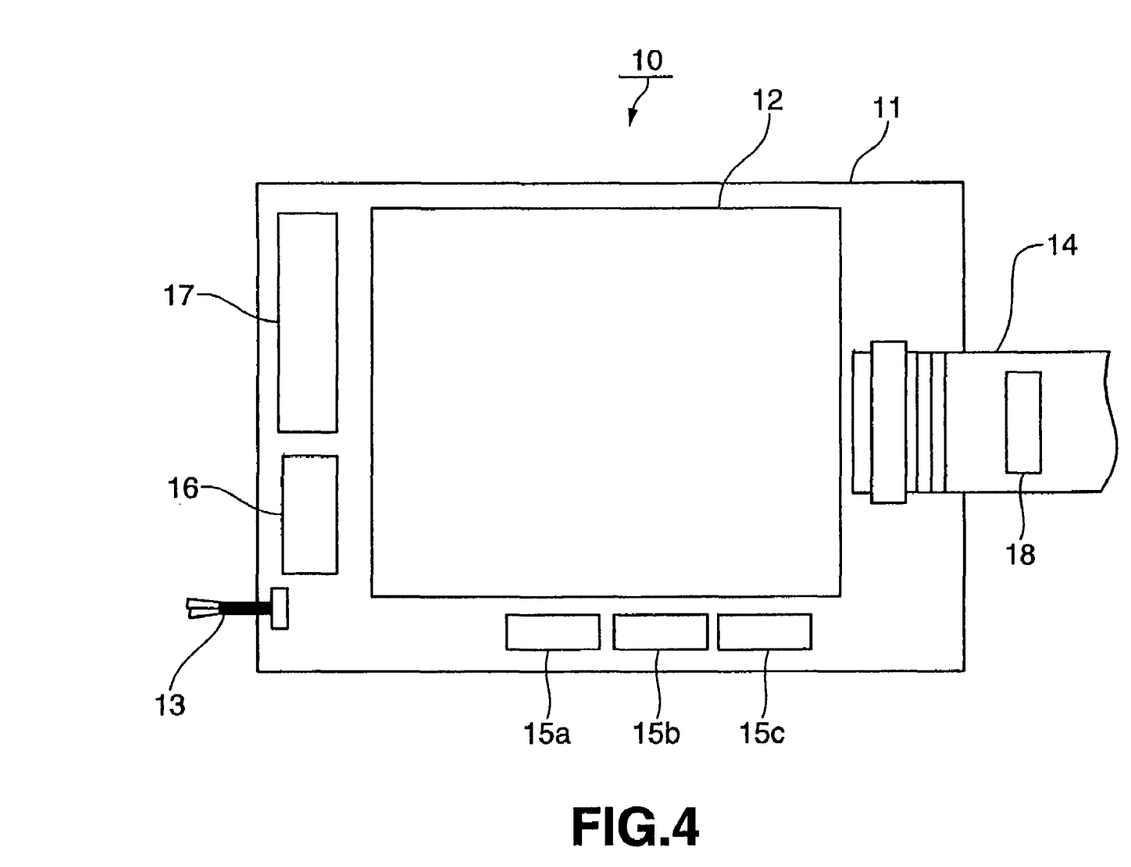
FIG. 4 is a schematic plan view of a system display to which the present invention is applied.

FIG. 4 is a schematic plan view of the system display 10 to which the present invention is applied.

The system display 10 includes a flat plate shaped glass substrate 11 as a transparent insulating substrate and a liquid crystal display part 12 formed in a rectangular shape at the central part of the glass substrate 11. Further, in the system display 10, to a peripheral edge part of the glass substrate 11 on which the liquid crystal display part 12 is not formed, a power supply cable 13 to which power is supplied and a flexible cable 14 for transmitting and receiving a data signal such as a video signal between an external device and the system display are connected. Further, in the system display 10, to the peripheral edge part of the glass substrate 11 on which the liquid crystal display part 12 is not formed, a power system controlling IC 16 for controlling a power, driving ICs 15a, 15b and 15c for driving the liquid crystal display part 12 in accordance with the video signal to display an image, and a memory IC 17 for storing data are attached. Further, on the flexible cable 14, an I/O control IC 18 for controlling the input and output of the data signal is attached.

Figure 5:
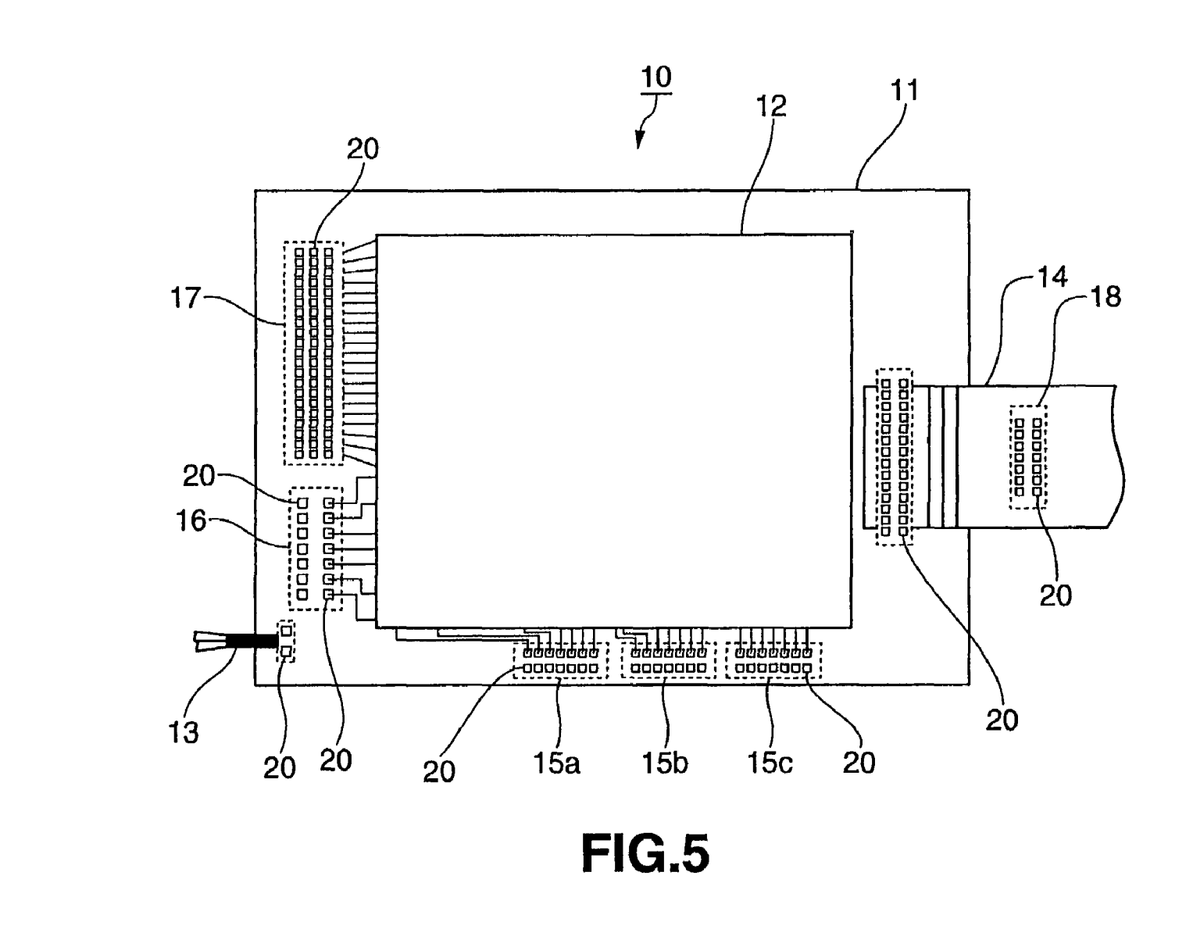
FIG. 5 is a schematic plan view of the system display from which IC or the like is removed to exposed electrodes.

Here, the various kinds of cables 13 and 14 and the various kinds of ICs 15 to 18 are mechanically attached to the glass substrate 11 by what is called a face down method and inner wiring is internally electrically connected to wiring formed in the glass substrate 11. An electric connection is achieved in such a way that connecting terminals called protruding bumps which are provided in the back surfaces of the various kinds of cables 13 and 14 and the various kinds of ICs 15 to 18 are allowed to abut from an upper part on a plurality of electrode parts 20 formed respectively at the attaching positions of the ICs on the glass substrate 11 or the flexible cable 14 as shown in FIG. 5.

Figure 6A:
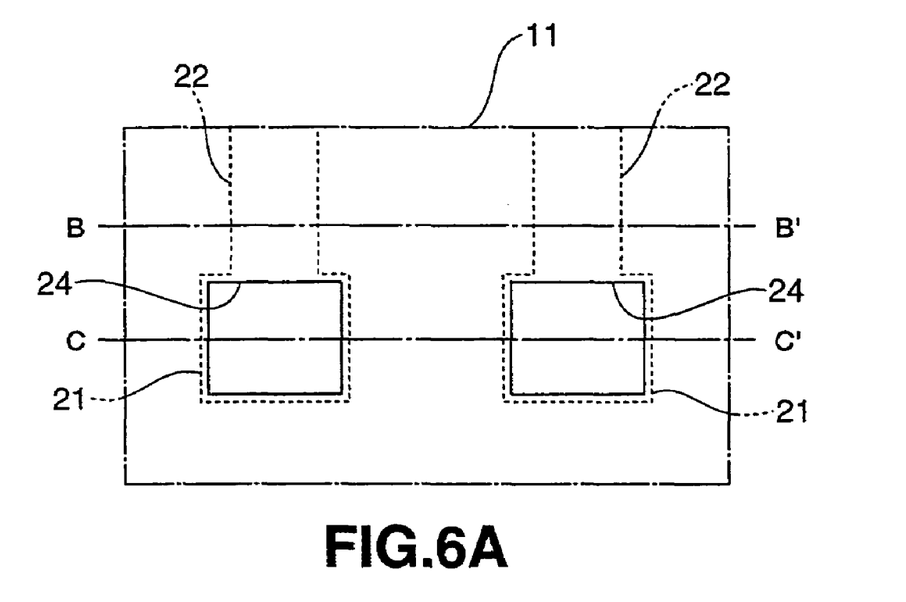
FIGS. 6A–6C are a view showing electrode parts after opening parts are formed on an interlayer dielectric film.
Figure 6B:
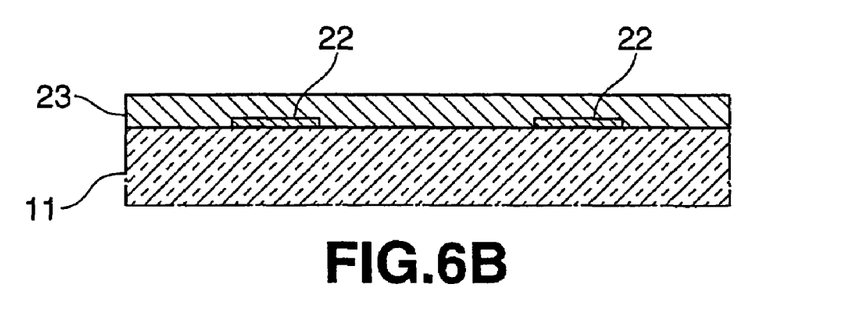
Figure 6C:
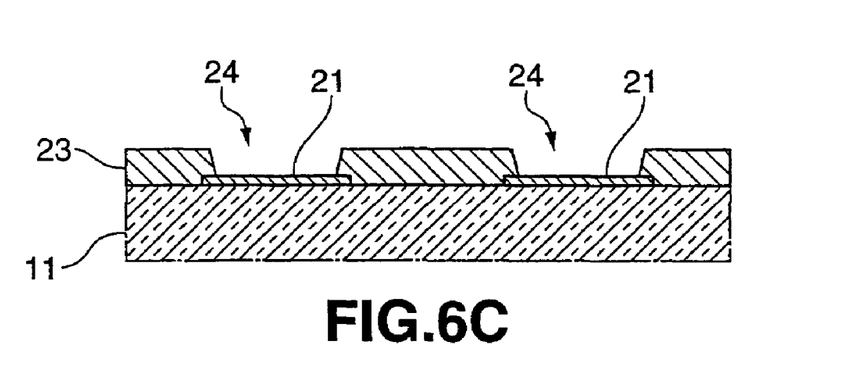
Figure 7A:
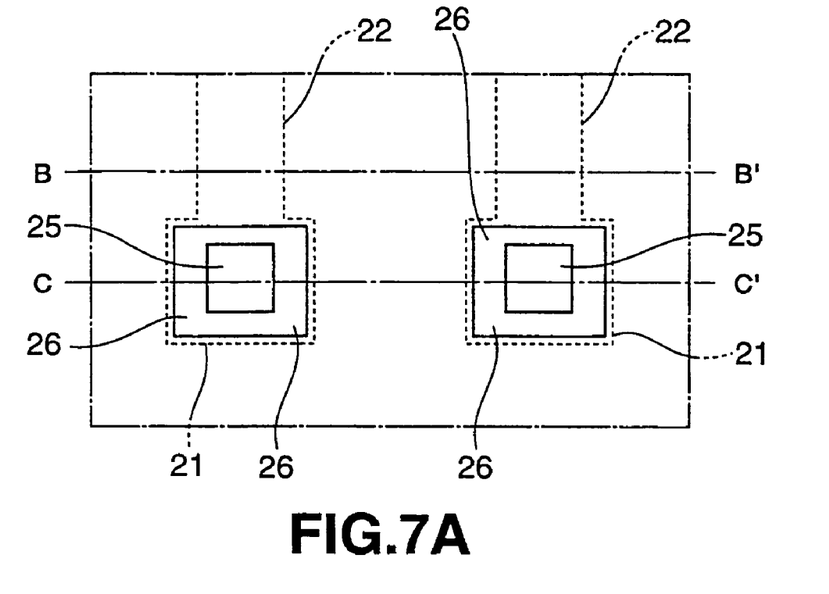
FIGS. 7A–7C are a view showing the electrode parts after second electrode pads are formed.
Figure 7B:
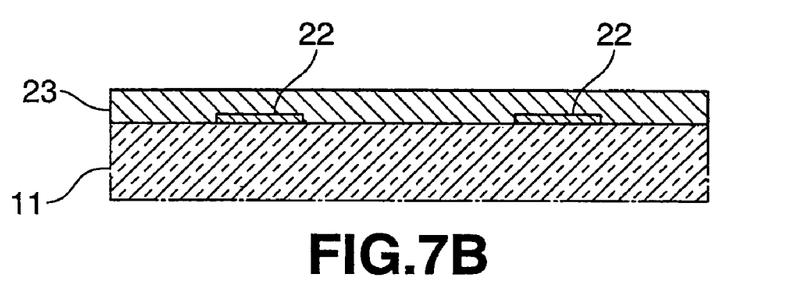
Figure 7C:
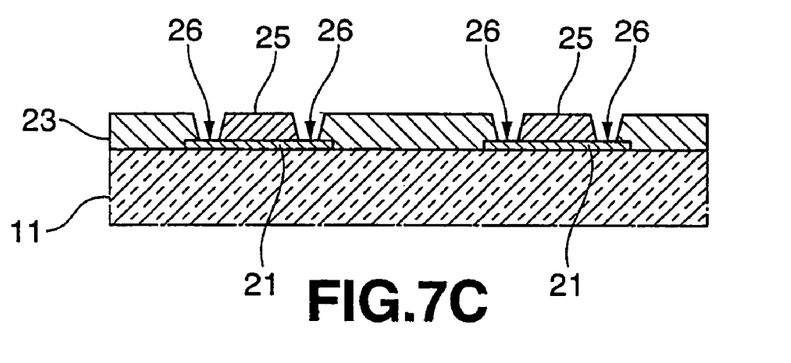
Figure 8A:
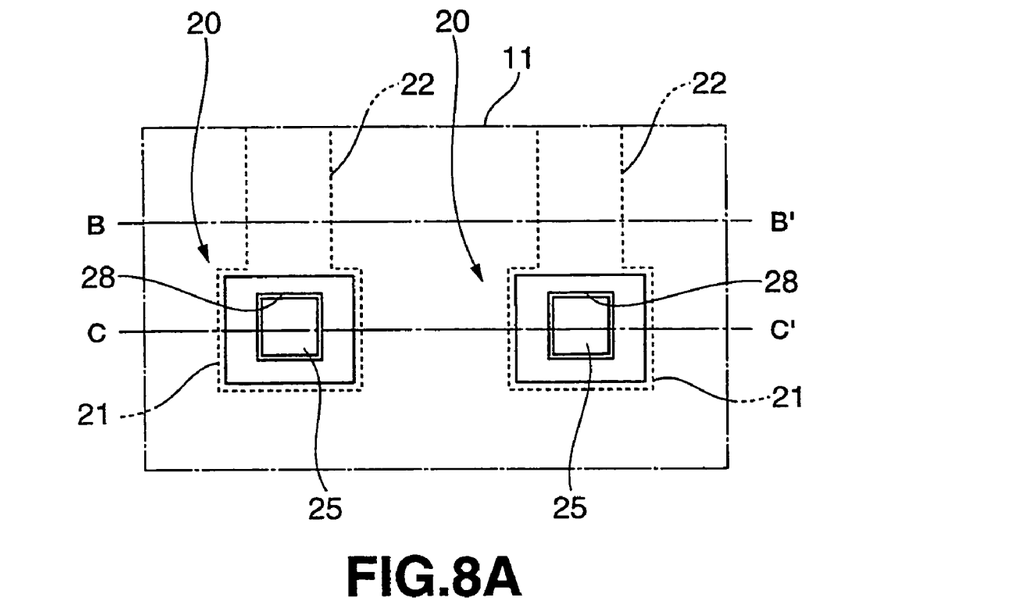
FIGS. 8A–8C are a view showing the completed electrode parts.
Figure 8B:
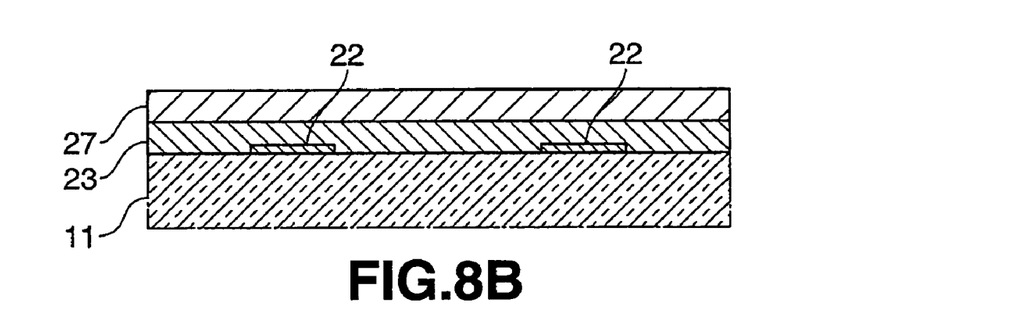
Figure 8C:
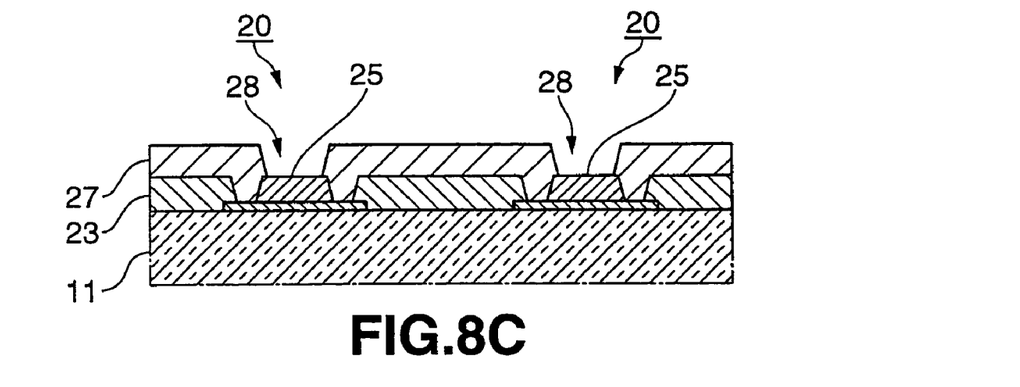

Then, processes for forming the electrode parts 20 on the glass substrate 11 will be described in detail by referring to FIGS. 6, 7 and 8. FIGS. 6A to 8A are plan views of the electrode parts 20. FIGS. 6B to 8B show sectional views taken along lines B–B' of FIGS. 6A to 8A. FIGS. 6C to 8C show sectional views taken along lines C–C' of FIGS. 6A to 8A.

Firstly, as shown in FIG. 6, first electrode pads 21 are formed at prescribed positions where the electrode parts 20 on the glass substrate 11 are disposed. The first electrode pads 21 are connected to the inner wiring 22 of the system display 10. The first electrode pads 21 are made of a material such as Mo having electrically conductive characteristics whose coefficient of thermal expansion is matched with the coefficient of thermal expansion of the glass substrate 11. The first electrode pads 21 are formed to the thickness of 30 nm to 500 nm by a deposition method or an electron beam method, and then, processed to substantially have the width of 30 μm to 40 μm by a micromachining technique to be formed at the prescribed positions.

Subsequently, an interlayer dielectric film 23 as an insulating film is formed on the glass substrate 11 after the first electrode pads 21 are formed. The interlayer dielectric film 23 is a film composed of, for instance, $SiO_x$, $SiN_x$ or the like as a main component and formed to the thickness of about 300 nm to 1 μm by for instance, a CVD method.

Then, the positions of the interlayer dielectric film 23 at which the first electrode pads 21 are formed (the prescribed positions at which the electrode parts 20 are arranged) are opened by, for instance, an etching technique to form opening parts 24 and expose the first electrode pads 21 serving as beds upward from the opening parts 24. Only the first electrode pads 21 are exposed from the opening parts 24 and the glass substrate 11 is not desirably exposed.

Subsequently, as shown in FIG. 7, second electrode pads 25 are formed on the first electrode pads 21 exposed from the opening parts 24. The second electrode pads 25 are formed in land shapes at least smaller in the planar direction than the opened parts of the opening parts 24. Namely, between the side wall parts of the second electrode pads 25 and the side walls around the peripheral edge parts of the opening parts 24, space areas 26 on which the first pads 21 are exposed. In other words, the second electrode pads 25 are formed so as not to be overlaid on the interlayer dielectric film 23. The second electrode pads 25 are formed with, for instance, an electrically conductive material such as Al. The second electrode pads 25 are formed to the thickness of 200 nm to 1000 nm by for instance, the deposition method, the electron beam method or the like, and then, formed in land shapes by, for instance, the etching technique.

The height of the second electrode pads 25 in the direction of thickness is desirably substantially the same as the height of the interlayer dielectric film 23. The materials of the first electrode pads 21 and the second electrode pads 25 are not limited to the combination of Mo and Al. As the material of the first electrode pads 21, a material hardly affected upon etching the second electrode pads 25 may be used. Further, when Al is used as the material of the second electrode pad 25, Si, Cu, Nd, Ti, etc. of about several percent may be included as well as high purity Al in accordance with processing conditions.

Then, after the second electrode pads 25 are formed, a planarizing film 27 having an insulating property is formed on the glass substrate 11. The planarizing film 27 is a film including, for instance, SiO$_x$, SiN$_x$ or an organic insulating film as a main component. The planarizing film is formed to the thickness of about 300 nm to 1 μm by, for instance, the CVD method or a spin coat method. After the film is formed, a surface is planarized.

Subsequently, as shown in FIG. 8, the positions of the planarizing film 27 where the second electrode pads 25 are formed (that is, the prescribed positions at which the electrode parts 20 are disposed) are opened by, for instance, the etching technique to form opening parts 28 and expose upward the second electrode pads 25 serving as beds from the opening parts 28. Only the upper surface parts of the second electrode pads 25 formed in the land shapes are exposed from the opening parts 28. Namely, the opening parts 28 are formed so that the side wall parts or the peripheral edges of the second electrode pads 25 are covered with the planarizing film 27. When the opening parts 28 are formed as described above, since the height of the second electrode pads 25 substantially corresponds to the height of the interlayer dielectric film 23, there is no step formed on the surface of the planarizing film 27.

When the above-described formation of the opening parts 28 is completed, the electrode parts 20 are formed on the glass substrate 11 of the system display 10.

Now, a method for directly attaching an IC on a part of the glass substrate 11 on which the liquid crystal display part 12 is not formed will be described below.

Figure 9:
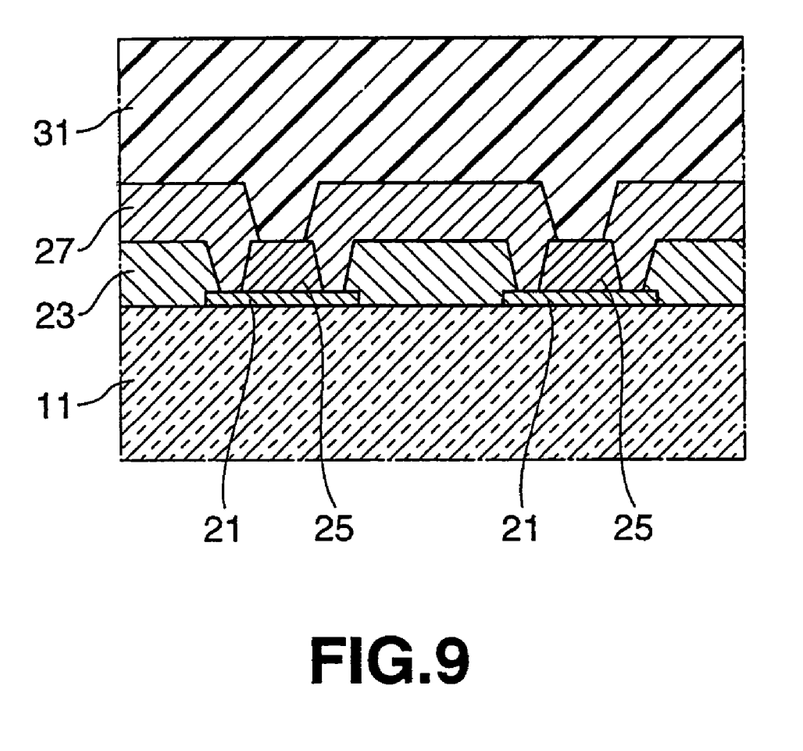
FIG. 9 is a sectional view showing that an anisotropic conductive film is transferred to the electrode parts.

Initially, as shown in FIG. 9, an adhesive anisotropic conductive film (ACF) 31 having an electrically conductive property in the direction of thickness is transferred to the attaching positions of the IC or cable connectors on the glass substrate 11.

Figure 10:
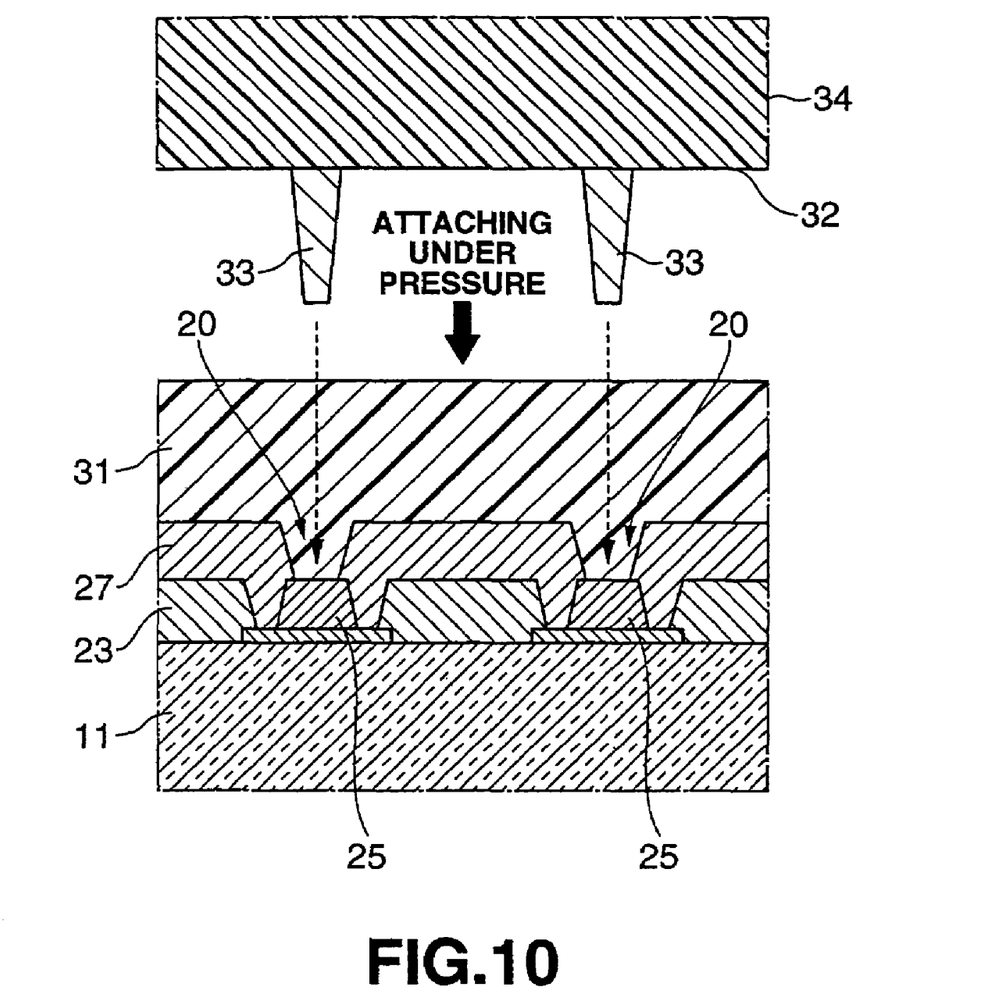
FIG. 10 is a sectional view for explaining a method for attaching under pressure an IC to the electrode parts.

Then, as shown in FIG. 10, the IC 34 having protruding bumps 33 provided in a bottom surface part 32 is disposed at a prescribed position on the glass substrate 11. The bumps 33 are external connecting terminals made of a metallic material connected to wiring in the IC 34. Then, while the relative positions of the glass substrate 11 and the IC 34 are adjusted so that the bumps 33 correspond to the corresponding electrode parts 20, the IC 34 is attached under pressure to the glass substrate 11 from an upper part.

Figure 11:
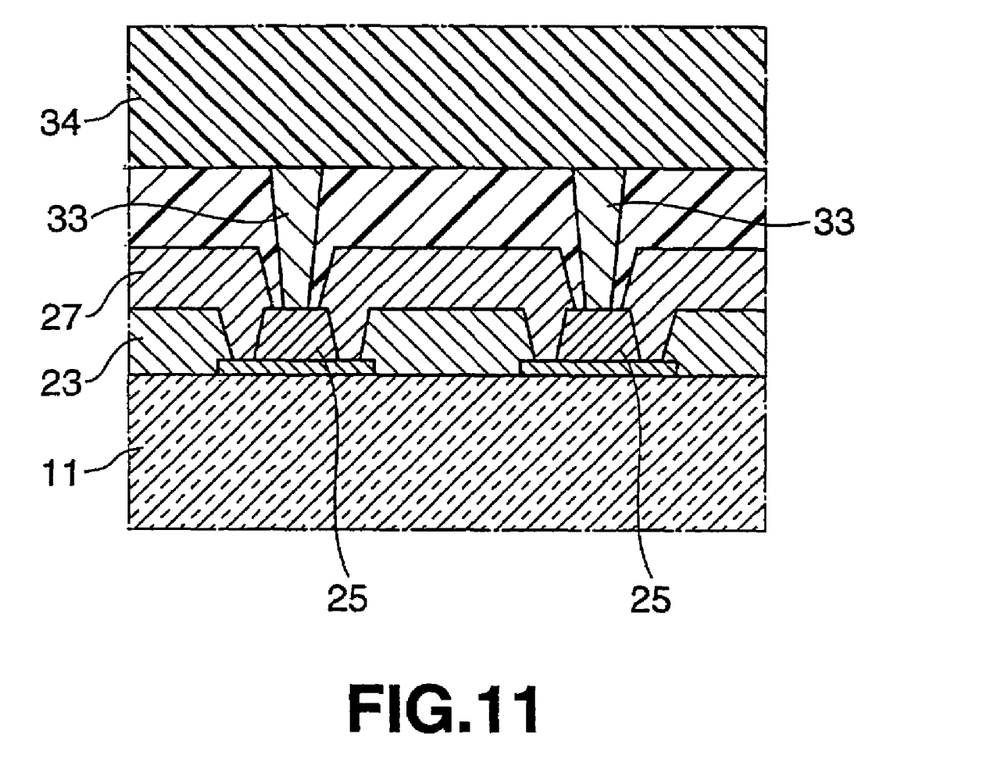
FIG. 11 is a sectional view of the electrode pans to which the IC is attached.

As a result, as shown in FIG. 11, the end parts of the bumps 33 abut on the upper surface parts of the second electrode pads 25 exposed on the bottom surface parts of the electrode parts 20. Thus, the second electrode pads 25 are electrically and mechanically connected to the bumps 33. Accordingly, the electric circuit wiring in the IC 34 is connected to the electric circuit wiring in the system display 10.

The anisotropic conductive film 31 serves to mechanically fix the IC 34 to the glass substrate 11 and has high impedance characteristics in the direction of thickness to remove high frequency noise.

As described above, in the system display 10, the size of the second electrode pads 25 in the planar direction is smaller than that of the opening parts formed in the interlayer dielectric film 23.

Consequently, in the system display 10, the planarization of the surface of the planarizing film 27 formed on the interlayer dielectric film 23 can be improved. As a result, when integrated circuit devices or semiconductor bare chips are attached from an upper part to electrically connect the IC to the electric circuit, an insufficient attachment can be decreased and an attaching operation can be performed with high reliability.

Figure 12:
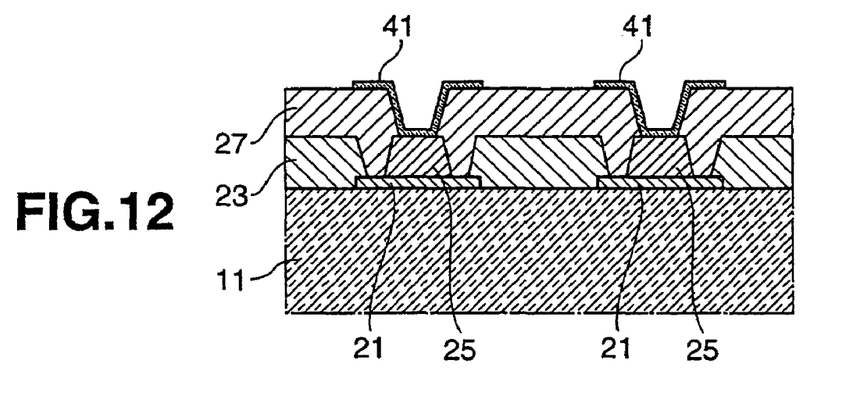
FIG. 12 is a sectional view of the electrode parts provided with ITO.
Figure 13:
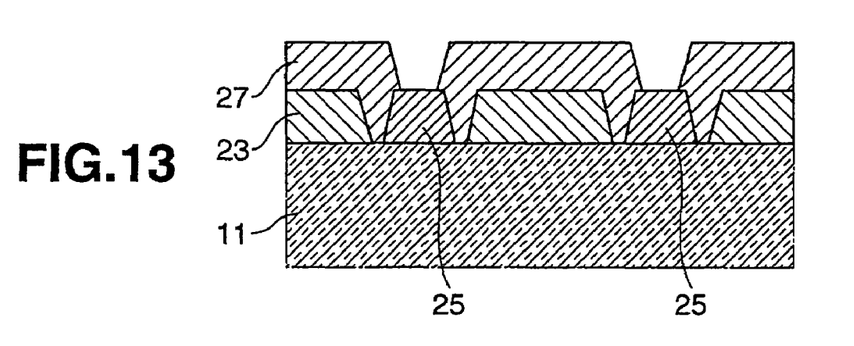
FIG. 13 is a sectional view of an electrode part formed with one electrode pad.
Figure 14:
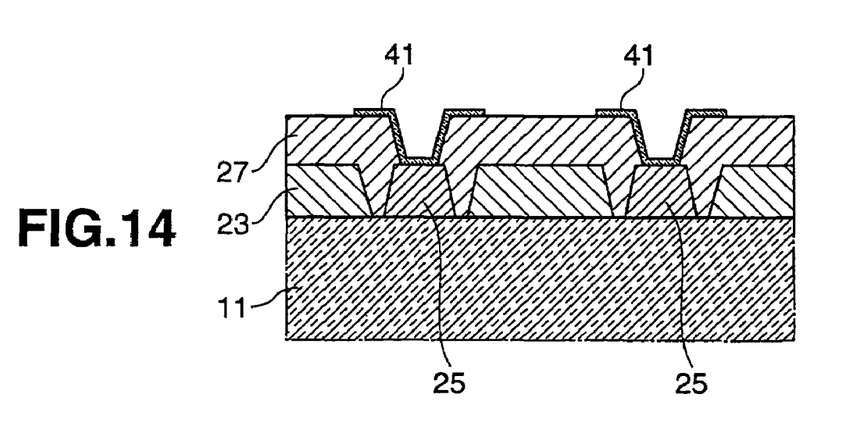
FIG. 14 is a sectional view of the electrode part formed with one electrode pad and provided with ITO.

In the above-described system display 10, the bumps are directly connected to the second electrode pads 25, however, for instance, as shown in FIG. 12, transparent electrodes 41 such as ITO may be further formed on the second electrode pads 25. Further as shown in FIG. 13, an electrode structure excluding the first electrode pads 21 may be employed. Still further, as shown in FIG. 14, the transparent electrodes 41 such as ITO may be provided in the structure excluding the first electrode pads 21.

In the system display 10, the glass substrate 11 is used as the substrate. However, any substrate having the insulating characteristics may be used without limiting to the glass substrate 11. The present invention may be applied to a flexible substrate. Further, not only the integrated circuit devices (IC) are connected to the insulating substrate, but also the bumps may be provided on the bottom surface of the semiconductor bare chips or the flexible substrate such as TCP (Tape-Carrier Package) and connected to the insulating substrate.

While the invention has been described in accordance with certain preferred embodiment thereof illustrated in the accompanying drawings and described in the above description in detail, it should be understood by those ordinarily skilled in the art that the invention is not limited to the embodiments, but various modifications, alternative constructions or equivalents can be implemented without departing from the scope and spirit of the present invention as set forth and defined by the appended claims.

What is claimed is:

1. An electric circuit substrate comprising:
   a substrate having an insulating property;
   an insulating film formed on the substrate;
   wiring formed in the substrate; and
   electrode pads made of an electrically conductive material which are connected to the wiring and to which a connecting terminal of an external device is connected from an upper part, wherein the insulating film has openings formed so as to expose the electrode pads upward and the electrode pads are smaller than the openings formed at corresponding positions, further composing:
   a protective film formed on the insulating film, wherein the protective film has openings formed so as to expose the electrode pads upward and the openings of the protective film are smaller than the electrode pads.

2. The electric circuit substrate according to claim 1, wherein the thickness of the insulating film is the same as the thickness of the electrode pads.

* * * * *